(12) United States Patent
Noh et al.

(10) Patent No.: US 11,758,762 B2
(45) Date of Patent: Sep. 12, 2023

(54) ELECTROLUMINESCENT DISPLAY INCLUDING PHOTO TUNABLE ADHESIVE

(71) Applicant: LG Display Co., Ltd., Seoul (KR)

(72) Inventors: HyunJong Noh, Paju-si (KR);
KyungSuk Min, Paju-si (KR);
Jinhyung Jung, Paju-si (KR);
TaeWoon Ko, Paju-si (KR);
YoungWook Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 115 days.

(21) Appl. No.: 17/125,997

(22) Filed: Dec. 17, 2020

(65) Prior Publication Data

US 2021/0193972 A1 Jun. 24, 2021

(30) Foreign Application Priority Data

Dec. 20, 2019 (KR) .................. 10-2019-0171930

(51) Int. Cl.
*H01L 51/00* (2006.01)
*H01L 51/52* (2006.01)
(Continued)

(52) U.S. Cl.
CPC ...... *H01L 51/5284* (2013.01); *H01L 27/3244* (2013.01); *H01L 51/524* (2013.01); *H01L 51/5253* (2013.01); *H01L 51/5281* (2013.01); *G02F 1/133512* (2013.01); *G02F 1/136209* (2013.01); *G09G 2300/0408* (2013.01);
(Continued)

(58) Field of Classification Search
CPC ............... H01L 51/5284; H01L 51/524; H01L 51/5253; H01L 51/5281; H01L 51/5246; H01L 51/5237; H01L 51/5262; H01L 51/0097; H01L 27/3244; H01L 27/3232; H01L 27/322; H01L 27/3211; H01L 27/3246; H01L 27/3272; H01L 27/3213; H01L 2251/301; H01L 2251/5338; G02F 1/133512; G02F 1/136209; G02F 2001/133357; G09G 2300/0408; G09G 2300/0804

See application file for complete search history.

(56) References Cited

U.S. PATENT DOCUMENTS

| 11,069,881 B2 * | 7/2021 | Jung | .................. H01L 51/0097 |
| 2010/0156765 A1 * | 6/2010 | Park | .................. H01L 27/3269 313/110 |

(Continued)

FOREIGN PATENT DOCUMENTS

| EP | 2 202 820 A1 | 6/2010 |
| KR | 10-2016-0026150 A | 3/2016 |
| KR | 10-2018-0062108 A | 6/2018 |

OTHER PUBLICATIONS

European Search Report dated May 25, 2021 issued in corresponding Patent Application No. 20215428.2 (9 pages).

*Primary Examiner* — Ida M Soward
(74) *Attorney, Agent, or Firm* — Polsinelli PC (57) ABSTRACT

An electroluminescent display includes a display panel including a plurality of pixels, each pixel having an emission area and non-emission area; and a protective film attached on one surface of the display panel using a photo tunable adhesive, wherein the photo tunable adhesive includes: a light transmitting area corresponding to the emission area; and a light blocking area corresponding to the non-emission area.

17 Claims, 5 Drawing Sheets

(51) Int. Cl.
    *H01L 27/32*     (2006.01)
    *G02F 1/13*     (2006.01)
    *G02F 1/1335*     (2006.01)
    *G02F 1/1362*     (2006.01)

(52) U.S. Cl.
    CPC .. *G09G 2300/0804* (2013.01); *H01L 27/3211* (2013.01); *H01L 27/3213* (2013.01); *H01L 27/3246* (2013.01); *H01L 27/3272* (2013.01); *H01L 51/0097* (2013.01); *H01L 2251/301* (2013.01); *H01L 2251/5338* (2013.01)

(56) References Cited

U.S. PATENT DOCUMENTS

| | | | |
|---|---|---|---|
| 2015/0048316 A1* | 2/2015 | Choi | H01L 51/5284 |
| | | | 257/40 |
| 2018/0061907 A1* | 3/2018 | Kim | H01L 27/322 |
| 2018/0151628 A1* | 5/2018 | Park | H01L 51/56 |
| 2018/0188866 A1* | 7/2018 | Heo | H01L 51/5253 |
| 2019/0326362 A1* | 10/2019 | Kim | H01L 51/5265 |

\* cited by examiner

ELECTROLUMINESCENT DISPLAY INCLUDING PHOTO TUNABLE ADHESIVE

CROSS-REFERENCE TO RELATED APPLICATION

This application claims the priority benefit of the Korean Patent Application No. 10-2019-0171930 filed on Dec. 20, 2019, which is hereby incorporated by reference in its entirety.

BACKGROUND

Field of the Disclosure

The present disclosure relates to an electroluminescent display reducing the reflectance of external lights. More specifically, the present disclosure relates to an electroluminescent display which maximizes the transmittance of the light emitting element and minimizes the external and/or ambient light reflectance by applying an adhesive layer containing a photochromic (or 'photo tunable') material without an optical film for selectively setting the light transmittance differently.

Description of the Background

Devices for displaying images have been developed in various forms such as CRT (Cathode Ray Tube), LCD (Liquid Crystal Display), PDP (Plasma Display Panel), and electroluminescent display. In particular, the electroluminescent display may include a self-luminous display or a curved self-luminous display. For example, the display may include a light emitting display panel, a micro LED display panel, a flexible light emitting display panel, a flexible micro LED display panel, or a quantum dot light emitting display panel, but it is not limited thereto. Such various types of display are used to display images of various products such as computers, mobile phones, bank deposit and withdrawal devices (ATM: Automated Teller Machine) and vehicle navigation systems according to their respective characteristics.

In order to solve the problem that the display screen is not normally observed as external lights such as sunlight or indoor lighting are reflected, the currently mainly used display may include an optical material in which a linear polarizing plate and a quarter wave plate are stacked.

SUMMARY

Accordingly, the present disclosure is to solve the problems described above and provide an electroluminescent display in which the image of the display may be normally observed by suppressing the reflection of the ambient/external lights without using multiple optical materials.

Another features of the present disclosure is to provide an electroluminescent display in which the total thickness is minimized by removing any additional optical films for reducing the reflection of external light. Still another features of the present disclosure is to provide an electroluminescent display having low power and high luminance characteristics by not adopting any additional optical film to ensure full luminance of the display panel.

In order to accomplish the above features of the present disclosure, an electroluminance display according to the present disclosure comprises: a display panel including a plurality of pixels, each pixel having an emission area and non-emission area; and a protective film attached on one surface of the display panel using a photo tunable adhesive, wherein the photo tunable adhesive includes: a light transmitting area corresponding to the emission area; and a light blocking area corresponding to the non-emission area.

In one example, the light transmitting area has a light transmittance rate of 90% or more, and the light blocking area has a light absorption rate of 95% or more.

In one example, the photo tunable adhesive includes the light blocking area selectively defined by irradiating the ultra-violet lights.

In one example, the display panel includes: a substrate including the plurality pixels; an display layer having a thin film transistor and a light emitting element disposed in each pixel on the substrate; and an encapsulation layer covering the display layer.

In one example, the photo tunable adhesive is deposited on a top surface of the encapsulation layer; and the protective film is attached onto the photo tunable adhesive.

In one example, the photo tunable adhesive is disposed onto the bottom surface of substrate; and the protective film is attached onto the photo tunable adhesive.

In one example, the electroluminescent display further comprises a cover plated attached onto the encapsulation layer with the photo tunable adhesive. The photo tunable adhesive is deposited on a top surface of the cover plate, and the protective film is attached on the photo tunable adhesive.

In one example, the protective film includes a ultra-violet light blocking film.

In one example, the protective film includes a ultra-violet protection coating layer and a scratch-preventing coating layer sequentially stacked on a surface of the substrate.

In one example, the protective film further includes an ambient reflection prevention coating layer.

In one example, the display panel includes: a display area defined at a middle area of the display panel; and a non-display area defined at a circumference surrounding the display area. The light blocking area of the photo tunable adhesive is disposed as corresponding to the non-emission area.

In addition, an electroluminescent display according to the present disclosure comprises: a substrate; a display area defined on the substrate, and a non-display area disposed outside of the display area on the substrate; a plurality of pixels disposed in the display area; an emission area disposed in the pixel, and a non-emission area surround the emission area in the pixel; a photo tunable adhesive disposed on one surface of the substrate; and a cover plate attached to the substrate with the photo tunable adhesive, wherein the photo tunable adhesive includes: a light blocking area corresponding to the non-display area and the non-emission area; and a light transmitting area corresponding to the emission area.

In one example, the photo tunable adhesive includes an optical adhesive material and a photochromic dye material.

In one example, the light blocking area has a visible light absorption rate of 95% or more, and the light transmitting area has a visible light transmittance rate of 90% or more.

The electroluminescent display according to the present disclosure may not include any additional optical film for reducing the reflectance of the ambient or external lights. Therefore, the present disclosure may provide an ultra-thin electroluminescent display. Further, according to the present disclosure, the luminance deterioration by the optical film may not occur so that higher luminance images may be provided with the same power. In addition, the power consumption for providing images with the same luminance may be reduced.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure. In the drawings.

DETAILED DESCRIPTION OF THE DISCLOSURE

Reference will now be made in detail to the exemplary aspects of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X axis direction", "Y axis direction" and "Z axis direction" may not be interpreted only as a geometric relationship in which the relationship between each other is perpendicular, and may mean that the configuration of the present disclosure has a wider scope to the extent that it may functionally work.

In describing the elements of the present disclosure, terms such as the first, the second, A, B, (a) and (b) may be used. These terms are only to distinguish the elements from other elements, and the terms are not limited in nature, order, sequence or number of the elements. When an element is described as being "linked", "coupled" or "connected" to another element that element may be directly connected to or connected to that other element, but indirectly unless otherwise specified. It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

The display panel according to the aspects of the present disclosure may include a liquid crystal display panel, an organic light emitting diode display panel, and an electroluminescent display panel, but it is not limited thereto. In addition, the display panel applied to the display apparatus according to the aspect of the present disclosure is not limited to the shape or size of the display panel.

Hereinafter, an example of a display apparatus according to the present disclosure will be described in detail with reference to the accompanying drawings. In designating reference numerals to elements of each drawing, the same components may have the same reference numerals as much as possible even though they are shown in different drawings. Scale of the elements shown in the accompanying drawings have a different scale from the actual for convenience of description, it is not limited to the scale shown in the drawings.

Figure 1:
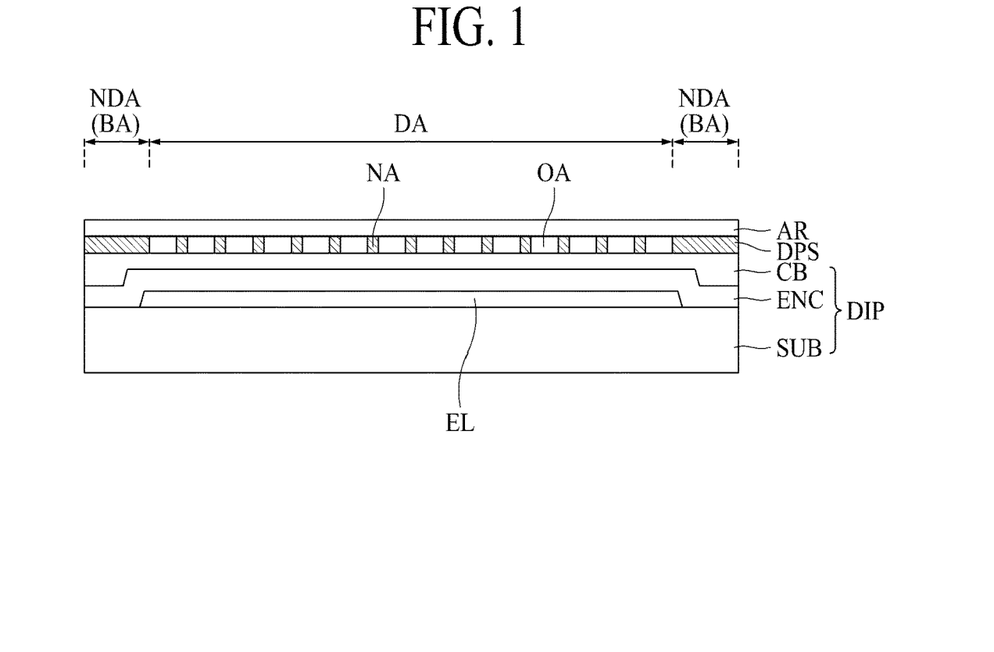
FIG. 1 is a cross-sectional view schematically illustrating an overall structure of an electroluminescent display according to the present disclosure.
Figure 2:
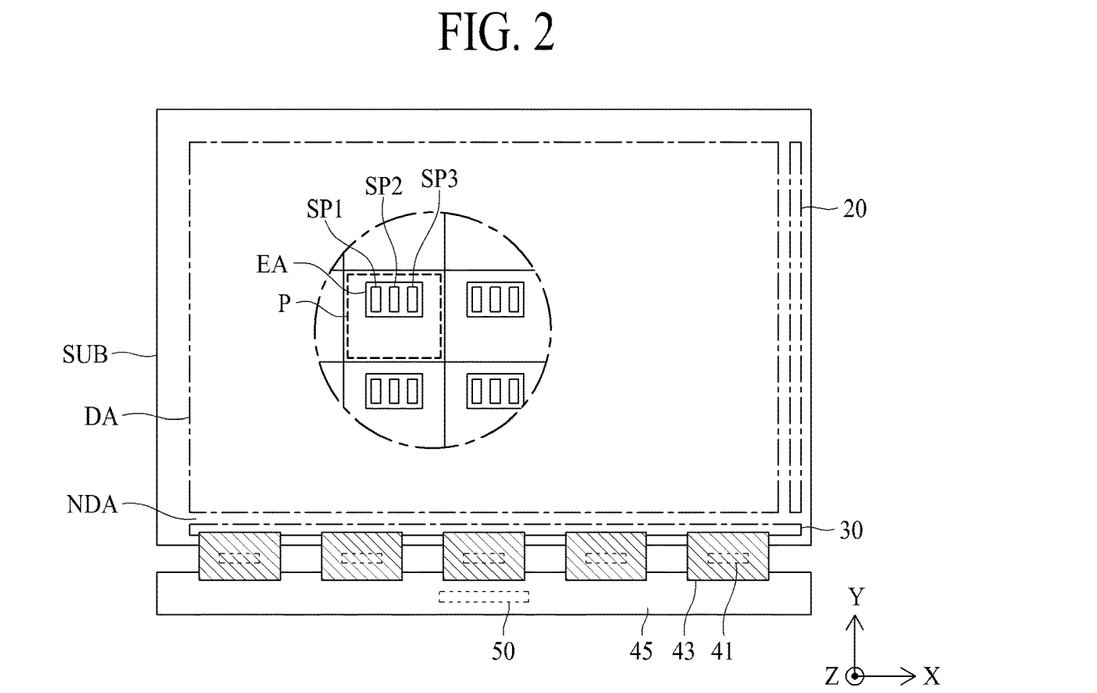
FIG. 2 is a plan view schematically illustrating an overall structure of an electroluminescent display according to the present disclosure.

Referring to FIGS. 1 and 2, an overall structure of an electroluminescent display according to the present disclosure will be explained. FIG. 1 is a cross-sectional view schematically illustrating an overall structure of an electroluminescent display according to the present disclosure. FIG. 2 is a plan view schematically illustrating an overall structure of an electroluminescent display according to the present disclosure.

Referring to FIG. 1, an electroluminescent display according to the present disclosure may comprise a display panel DIP and a protective film AR. In particular, the display panel DIP and the protective film AR may be attached each other using a photo tunable adhesive layer DPS.

The display panel DIP may be selected any one of a liquid crystal display panel, a plasma display panel, an electroluminescent display panel and other flat display panels. In the case that the electroluminescent display panel is applied, the display panel DIP may include a self-luminous display panel or a curved self-luminous display panel. In detail, the display panel DIP may include a light emitting display panel, a micro LED display panel, a flexible light emitting display panel, a flexible micro LED display panel, or a quantum dot light emitting display panel, but aspects are not limited thereto.

The display panel DIP may include a substrate SUB, a display layer EL, an encapsulation layer ENC and a cover plate CB. The display layer EL may be formed on one surface of the substrate SUB. The encapsulation layer ENC may be disposed on overall surface of the substrate SUB for covering the display layer EL. The cover plate CB may be attached on the encapsulation layer ENC.

The substrate SUB of the display panel DIP may be made of a transparent material. The display layer EL may include a plurality of pixel areas arrayed in a matrix manner. In each pixel area, a driving element and an emission element may be disposed. The driving element may include a thin film transistor and a storage capacitor. The emission element may be an electroluminescent element of which brightness may be controlled by the driving element. The electroluminescent element may include an organic light emitting diode or an inorganic light emitting diode.

The encapsulation layer ENC may be for protecting the display layer EL by preventing gases or foreign materials from penetrating from the outside. The encapsulation layer ENC may have a structure in which inorganic layers and organic layers are alternately stacked each other.

The cover plate CB may be a transparent and rigid substrate such as a glass substrate. The cover plate CB may be a transparent protective substrate for preventing the encapsulation layer ENC and the display layer EL from the external forces.

Referring to FIG. 2, the display panel DIP may include a substrate SUB, a gate (or scan) driver 20, a data pad part 30, a source driving integrated circuit (IC) 41, a flexible film 43, a circuit board 45 and a timing controller 50.

The substrate SUB may include a display area DA and a non-display area NDA. The display area DA may be an area for representing the video images and may be defined at the most areas including middle area, but aspects are not limited thereto. In the display area DA, a plurality of scan lines (or gate lines) (not shown), a plurality of data lines (not shown) and a plurality of pixels P may be formed.

On the substrate SUB, a plurality of pixels P may be arrayed in a matrix manner. In addition, in each pixel P, one emission area EA may be defined. In one pixel P, the area excepting the emission area EA may include the driving element, the scan line and the data line.

One emission area EA may include at least three sub-emission areas SA1, SA2 and SA3. For example, one emission area EA may include a red sub-emission area SA1, a green sub-emission area SA2 and a blue sub-emission area SA3. Even though it is not shown in figures, for another example, one pixel area may include a red sub-pixel area, a green sub-pixel area, a blue sub-pixel area and a white sub-pixel area. The red sub-pixel area may include a red sub-emission area, the green sub-pixel area may include a green sub-emission area, the blue sub-pixel area may include a blue sub-emission area, and the white sub-pixel area may include a white sub-emission area. A black matrix may be disposed between each emission area EA. In addition, the black matrix may be further disposed between each sub-emission areas SA1, SA2 and SA3.

The non-display area NDA may be the area where the video image may be not presented, and may be defined at the circumference area of the substrate SUB as surrounding the display area DA. The non-display area NDA may include the gate driver 20 and the data pad part 30.

The gate driver 20 may supply the scan (or gate) signal to the plurality of scan lines according to the gate control signal received from the timing controller 50. The gate driver 20 may be formed in the non-display area NDA one outside of the display area DA of the substrate SUB in a GIP (Gate driver In Panel) method. The GIP method refers to a structure in which the gate driver 20 including thin film transistors and capacitors is directly formed on a substrate SUB.

The data pad part 30 may supply the data signals to the plurality of data lines according to the data control signal received from the timing controller 50. At the data pad part 30 disposed at the non-display area NDA of any one outer side of the display area DA of the substrate SUB, one side of the flexible film 43 on which the source driving integrated circuit 41 is mounted may be attached using the TAB (Tape Automated Bonding) method.

The source driving integrated circuit 41 may receive the digital video data and the source control signal from the timing controller 50. The source driving integrated circuit 41 may convert the digital video data into the analog data voltages according to the source control signal, and supply them to the data lines. In the case that the source driving integrated circuit 41 is formed in a chip, the source driving integrated circuit 41 may be mounted on the flexible film 43 in a COF (Chip On Film) method or COP (Chip On Plastic) method.

The flexible film 43 may include a plurality of first lines for connecting the data pad par 30 and the source driving integrated circuit 41 and a plurality of second lines for connecting the data pad part 30 and the circuit board 45. The flexible film 43 may be attached on the data pad part 30 using an anisotropic conducting film (or ACF) to connect the data pad part 30 to the lines formed in the flexible film 43.

The circuit board 45 may be attached to the flexible film 43. The circuit board 45 may include a plurality of electronic circuits made in the driving chip type. For example, the circuit board 45 may include the timing controller 50. The circuit board 45 may be the printed circuit board or the flexible printed circuit board.

The timing controller 50 may receive the digital video data and the timing signals from an external system board through the cable of the circuit board 45. The timing controller 50 may generate the gate control signal for controlling the operating timing of the gate driver 20 based on the timing signal and the source control signal for controlling the source driving integrated circuits 41. The timing controller 50 may supply the gate control signal to the gate driver 20 and supply the source control signal to the source driving integrated circuits 41. In one example, the timing controller 50 may be integrated with the source driving integrated circuit 41 to be one driving chip and may be mounted on the substrate SUB.

Figure 3:
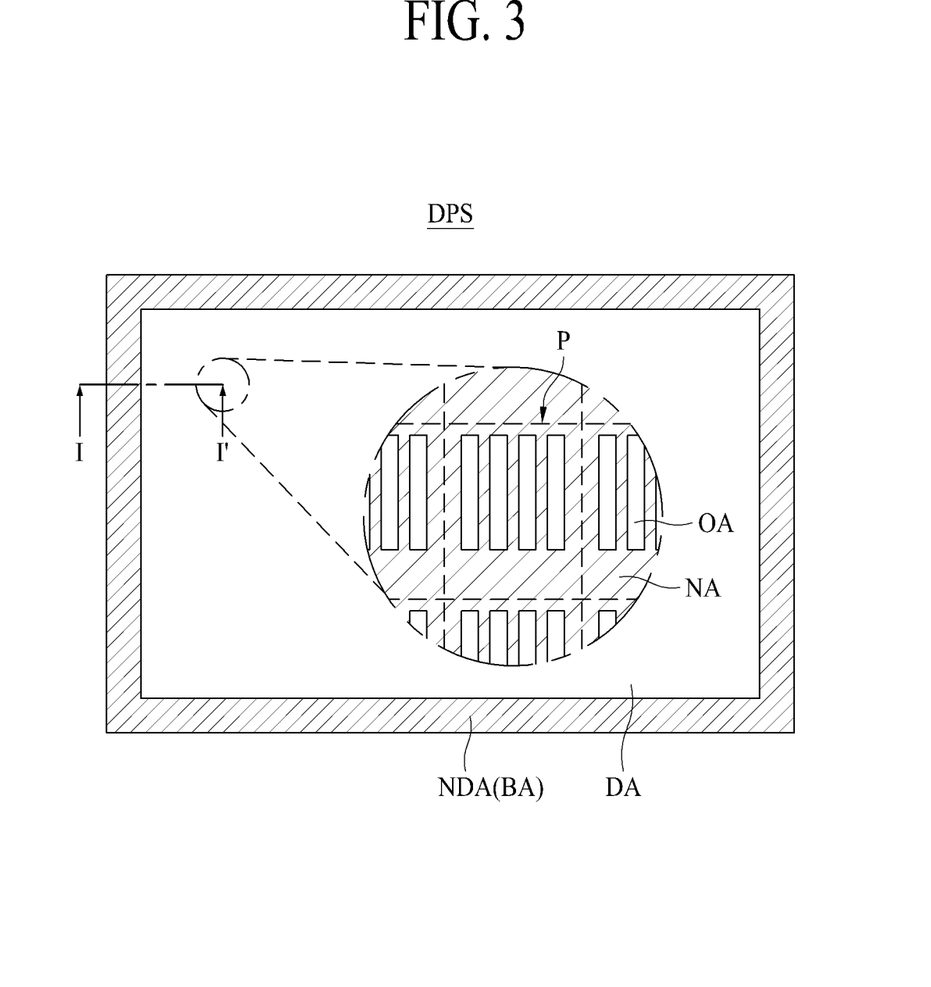
FIG. 3 is a plan view schematically illustrating a structure of a photo tunable adhesive applied in an electroluminescent display according to the present disclosure.

Hereinafter, further referring to FIG. 3, the photo tunable adhesive layer DPS is included into an electroluminescent display according to the present disclosure. FIG. 3 is a plan view schematically illustrating a structure of a photo tunable adhesive applied in an electroluminescent display according to the present disclosure.

The photo tunable adhesive layer DPS may bonds the protective film AR and the display panel DIP, in a face to face manner. The protective film AR may be a film element for protecting overall surface of the display panel DIP mechanically and optically. In one example, the protective film AR may be a transparent ultra-violet light protecting film which may absorb the ultra-violet lights. In another example, the protective film AR may be a ultra-violet light blocking film with a reinforcing coating layer and/or an anti-reflective coating layer on the outer surface.

The photo tunable adhesive may include a photochromic dye evenly dispersed in an optical adhesive. The optical adhesive may include a pressure sensitive adhesive and/or an optical clear adhesive. The photochromic dye may include a material that is discolored (or changed into black) by ultra-violet rays having a wavelength of 100 to 400 nm, especially ultra-violet rays of a wavelength of 300 to 370 nm. In one example, the photochromic dyes may be a material that discolors to have a visible light absorption rate of 95% or more and a visible light transmittance rate of 5% or less, when photochromic dyes are irradiated with a ultra-violet ray in the 365 nm wavelength band with the energy of 2,000 mJ/cm$^3$.

After applying the photo tunable adhesive (or, photochromic adhesive) DPS to the surface of the display panel DIP and before bonding the protective layer AR, the photo tunable adhesive DPS may be divided into a light blocking area NA and a light transmitting area OA. The light blocking area NA may have the visible light absorption rate of 95% or more, and the light transmitting area OA may have the visible light transmittance rate of 90% or more.

In one example, the photo tunable adhesive layer DPS may have the visible light transmittance ratio of 90% or more. After depositing the photo tunable adhesive layer DPS on the top surface of the display panel DIP, with the condition that the transmitting area OA is covered and the light blocking area NA is exposed using a screen mask, the ultra-violet light having a wavelength of 365 nm is irradiated. Then, only the light blocking area NA may be selectively discolored to have the absorption rate of visible light of 95% or more. Since the ultra-violet lights are not irradiated to the light transmitting area OA, the transmittance ratio of visible light may be maintained at 90% or more. After that, the protective film AR may be attached on the photo tunable adhesive layer DPS.

The light blocking area NA may correspond to all areas except for the emission area EA in the display area DA of the display panel DIP. The light blocking area NA may include areas corresponding to all areas of the non-display area NDA of the display panel DIP.

<First Aspect>

Figure 4:
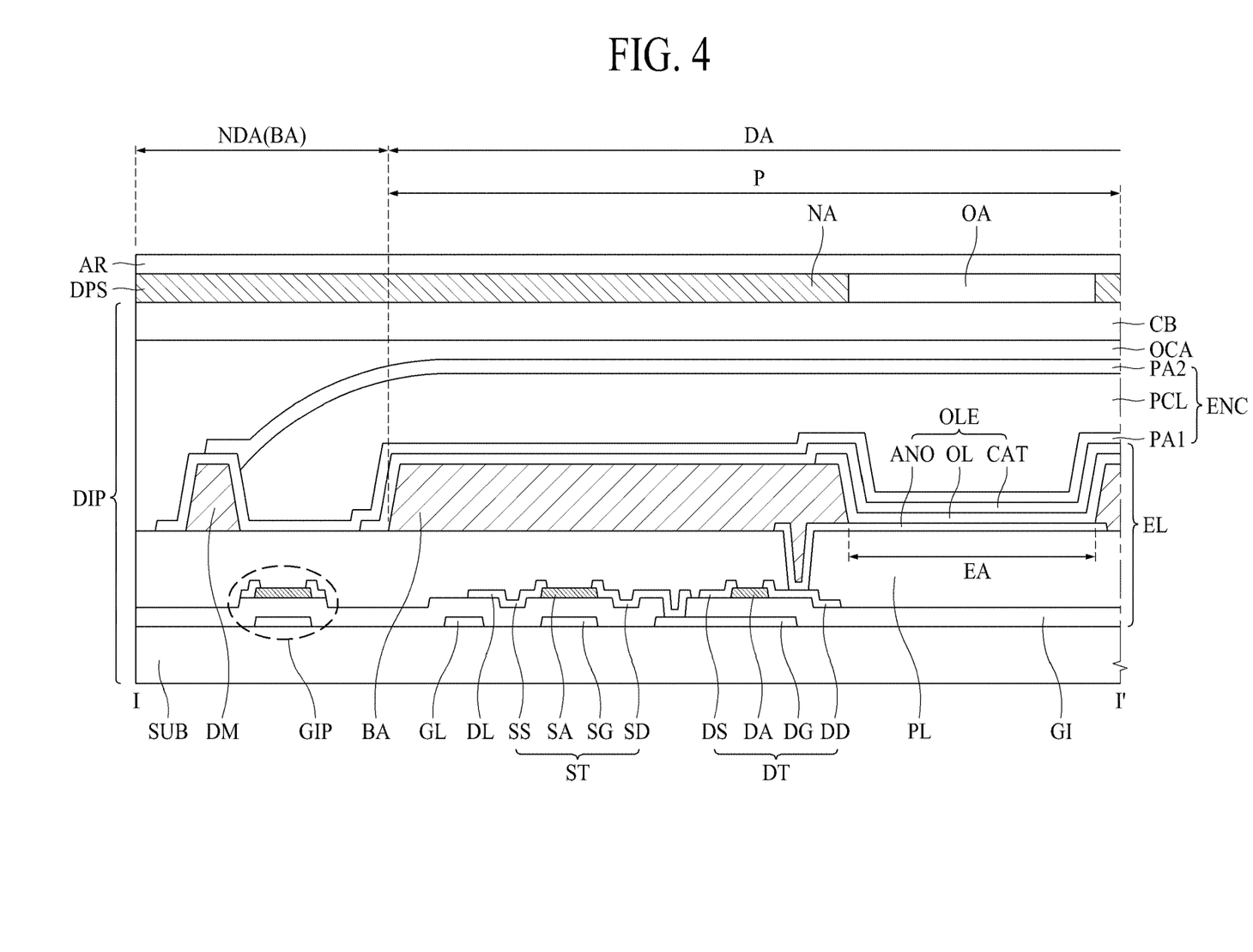
FIG. 4 is a cross-sectional view, along the cutting line I-I' in FIG. 3, illustrating a structure of an electroluminescent display according to a first aspect of the present disclosure.

Hereinafter, referring to FIG. 4, a detailed structure of an electroluminescent display according to the first aspect of the present disclosure will be explained. FIG. 4 is a cross-sectional view, along the cutting line I-I' in FIG. 3, illustrating a structure of an electroluminescent display according to a first aspect of the present disclosure.

Referring to FIG. 4, an electroluminescent display according to the first aspect of the present disclosure may comprise a display panel DIP, a protective film AR and a photo tunable adhesive layer DPS. In particular, the protective film AR may be attached on the top surface of the display panel DIP by the photo tunable adhesive layer DPS. Here, the top surface of the display panel DIP refers to the surface on which image information is provided.

The display panel DIP may include a display area DA and a non-display area NDA. The display area DA may be an area for representing the video images and may be defined at the most areas including middle area. The non-display area NDA may be defined at the circumference area surrounding the display area DA. In the non-display area NDA, the driving circuits such as a gate driver GIP may be disposed.

The display panel DIP may include a substrate SUB, a display layer EL, an encapsulation layer ENC and a cover plate CB. The display layer EL may be formed on the top surface of the substrate SUB. Here, the top surface refers to a surface on which the video image is output. The display layer EL may include thin film transistors ST, DT and GIP and the light emitting element OLE.

In one example, in the display area DA, a switching thin film transistor ST and a driving thin film transistor DT may be disposed in each pixel P. In the non-display area NDA, the gate driver GIP may be disposed. Even though not shown in figures, the gate driver GIP may be configured to control the switching thin film transistor ST.

A gate line GL, a switching gate electrode SG of the switching thin film transistor ST and a driving gate electrode DG of the driving thin film transistor DT may be formed on the substrate SUB. The switching gate electrode SG may be branched from the gate line GL. In addition, a gate electrode of the gate driver GIP may be formed of the same layer and material with the switching gate electrode SG and the driving gate electrode DG. A gate insulating layer GI may be deposited on the gate electrodes SG and DG and the gate line GL as covering whole surface of the substrate SUB.

A switching semiconductor layer SA overlapping with the switching gate electrode SG and a driving semiconductor layer DA overlapping with the driving gate electrode DG are formed on the gate insulating layer GI. In addition, a semiconductor layer may be formed on the gate electrode of the gate driver GIP.

A switching source electrode SS may be formed on one side of the switching semiconductor layer SA and a switching drain electrode SD may be formed on opposite side of the switching semiconductor layer SA. The switching source electrode SS may be branched from the data line DL. A driving source electrode DS may be formed on one side of the driving semiconductor layer DA and a driving drain electrode DD may be formed on opposite side of the driving semiconductor layer DA. The switching drain electrode SD may be connected to the driving gate electrode DG through a contact hole formed at the gate insulating layer GI. In addition, a source electrode and a drain electrode may be formed on the semiconductor layer of the gate driver GIP which are separated each other.

A planarization layer PL may be deposited on the switching thin film transistor ST and the driving thin film transistor DT and the gate driver GIP as covering the whole surface of the substrate SUB. The light emitting element OLE may be formed on the planarization layer PL.

The light emitting element OLE may include an anode electrode ANO, an emission layer OL and a cathode electrode CAT. The anode electrode ANO may be formed on the planarization layer PL and connected to the driving drain electrode DD of the driving thin film transistor DT through a contact hole penetrating the planarization layer PL.

A bank BA may be formed on the anode electrode ANO. The bank BA may expose most middle areas of the anode electrode ANO and cover the circumferences of the anode electrode ANO to define the emission area EA.

The emission layer OL may be formed on the bank BA and the anode electrode ANO. In one example, the emission layer OL may be formed by being separated or divided into each emission area EA. In this case, any one of a red emission layer, a green emission layer and a blue emission layer may be formed for each sub-pixel. For another example, the emission layer OL may be formed to continuously cover the whole of the display area DA. In that case, color filters (not shown) corresponding to each emission area EA may be formed on the light emitting element OLE. In detail, the color filters may be formed on the bottom surface of the cover plate CB.

The cathode electrode CAT may be formed on the emission layer OL. The cathode electrode CAT may be continuously deposited over the whole of the display area DA. In addition, the cathode electrode CAT may be extended to some of the non-display area NDA over the display area DA. For example, the cathode electrode CAT may have a structure to cover the upper portion of the gate driver GIP to shield the gate driver GIP.

According to the first aspect of the present disclosure, the light emitting element OLE may be the top emission type in which the lights are provided to upper surface of the substrate SUB. Therefore, the anode electrode ANO may have a reflective metal material and the cathode electrode CAT may have a transparent conductive material. In one example, considering the work function, the anode electrode ANO may have a stacked structure in which a reflective metal layer and a transparent conductive layer are sequentially deposited. The cathode electrode CAT may be formed of reflective metal material having relatively low resistance such as silver (Ag) with a very thin thickness of tens nanometer to enhance the light transmittance.

The encapsulation layer ENC may be disposed on the cathode electrode CAT for protecting the light emitting element OLE. The encapsulation layer ENC may prevent the gases or the foreign materials from intruding into the display layer EL. The encapsulation layer ENC may have a multiple layer structure in which inorganic layers and organic layers are stacked alternately.

For example, the encapsulation layer ENC may include a first inorganic layer PA1, an organic layer PCL on the first inorganic layer PA1 and a second inorganic layer PA2 on the organic layer PCL. The first inorganic layer PA1 and the second inorganic layer PA2 may plays role of blocking the penetration of moisture or oxygen. In one example, the first inorganic layer PA1 and the second inorganic layer PA2 may include at least one inorganic material such as silicon nitride, aluminum nitride, zirconium nitride, titanium nitride, hafnium nitride, tantalum nitride, silicon oxide, aluminum oxide or titanium oxide. The first inorganic layer PA1 and the second inorganic layer PA2 may be formed by the chemical vapor deposition (CVD) method or the atomic layer deposition (ALD) method.

The organic layer PCL may be surrounded (or 'sandwiched and packed') by the first inorganic layer PA1 and the second inorganic layer PA2. The organic layer PCL may have a relatively thick thickness compared to the first inorganic layer PA1 and the second inorganic layer PA2 so as to adsorb and/or to block particles that may occur during the manufacturing processes. The organic layer PCL may be made of an organic material such as silicon oxycarbide (SiOC) acrylic resin or epoxy based resin. The organic layer PCL may be formed by a coating process such as an inkjet coating process or a slit coating process.

A dam DM may be formed in the non-display area NDA to surround the display area DA so that the organic layer PCL is disposed within the area where the light emitting element OLE is formed. The organic layer PCL may be disposed inner space surrounded by the dam DM.

The cover plate CB may be attached on the encapsulation layer ENC. For example, applying an optical adhesive OCA on the upper surface of the encapsulation layer ENC, the cover plate CB may be attached thereon. The cover plate CB may be a transparent rigid substrate such as glass substrate. The cover plate CB may be a transparent protective substrate for preventing damage to the encapsulation layer ENC and the display layer EL disposed below by the external forces.

The photo tunable adhesive layer DPS may be disposed on the top surface of the cover plate CB. The photo tunable adhesive layer DPS may include a light blocking area NA and a light transmitting area OA. The light blocking area NA may have the visible light absorption ratio of 95% or more, and the light transmitting area OA may have a visible light transmittance ratio of 90% or more.

The light blocking area NA may be defined as corresponding to the non-emission area excepting the emission area EA within the display area DA. In addition, the light blocking area NA may be defined as corresponding to the whole of the non-display area NDA. In FIG. 4, some of the thin film transistors ST and DT disposed in the display area DA may be adjacent to the no-display area NDA. Therefore, the light blocking area NA may be extended somewhat to the non-emission area of the display area DA from the non-display area NDA.

The light transmitting area OA may be defined as corresponding to the emission area EA defined in the light emitting element OLE formed in each of the pixels P disposed in the display area DA. In FIG. 4, one pixel P has one emission area EA. However, one pixel P may have three emission areas including a red emission area, a green emission area and a blue emission area. The emission area EA may be defined by the exposed portion of the bank BA. Therefore, the mask for defining the light transmitting area OA may be the same mask used for forming the bank BA.

The protective film AR may be attached onto the photo tunable adhesive layer DPS. The protective film AR may be made of transparent rigid material, but aspects are not limited thereto. For example, for the flexible display, the protective film AR may be a transparent flexible film material.

The protective film AR may have a ultra-violet light blocking property of 98% or more in order to prevent the light transmitting area OA of the photo tunable adhesive layer DPS from being discolored by the ultra-violet lights of sunlight. For example, the protective film AR may be made of a ultra-violet light blocking material. For another example, the protective film AR may be made by sequentially stacking the ultra-violet blocking coating layer and a scratch-resistant coating layer on the upper surface of the transparent film. The scratch-resistant coating layer may be for preventing the ultra-violet light blocking coating layer from being peeled off due to the external forces or stresses.

In some cases, a coating layer for preventing the reflection of ambient light may be further included. The ambient light reflection prevention coating layer may be inferior performance of light reflection prevention ability compared to the combination of the linear polarizer and the quarter wave plate applied in the conventional art. In the first aspect of the present disclosure, the ambient lights may be reflected through only the light transmitting area OA so that the total light reflection ratio over the whole display panel may be lower than 5%. Further, the ambient light reflection prevention coating layer may not reduce the light transmittance of the lights provided from the light emitting element. Therefore, the structure of the first aspect may be suitable for achieving the aspects of the present disclosure.

In the electroluminescent display according to the first aspect of the present disclosure, a photo tunable adhesive having visible light absorption rate of 95% or more is disposed in the non-emission areas excluding the emission areas. Therefore, the ambient light reflectance of less than 5% may be acquired without having a linear polarizer and a quarter wave plate to prevent the ambient light reflection.

Since the optical film for preventing the reflection of ambient light is not included, the overall thickness of the display may be thinner than related art, and the manufacturing cost may be saved. In particular, the optical films for preventing reflection of ambient light may reduce about 50% of light amount (luminance or brightness) from the light emitting element, so higher electric power consumption may be required to provide desired luminance. However, the electroluminescent display according to the first aspect of the present disclosure may not include any optical element reducing the light amount provided from the light emitting element, so the same luminance may be provided with lower power consumption.

<Second Aspect>

Figure 5:
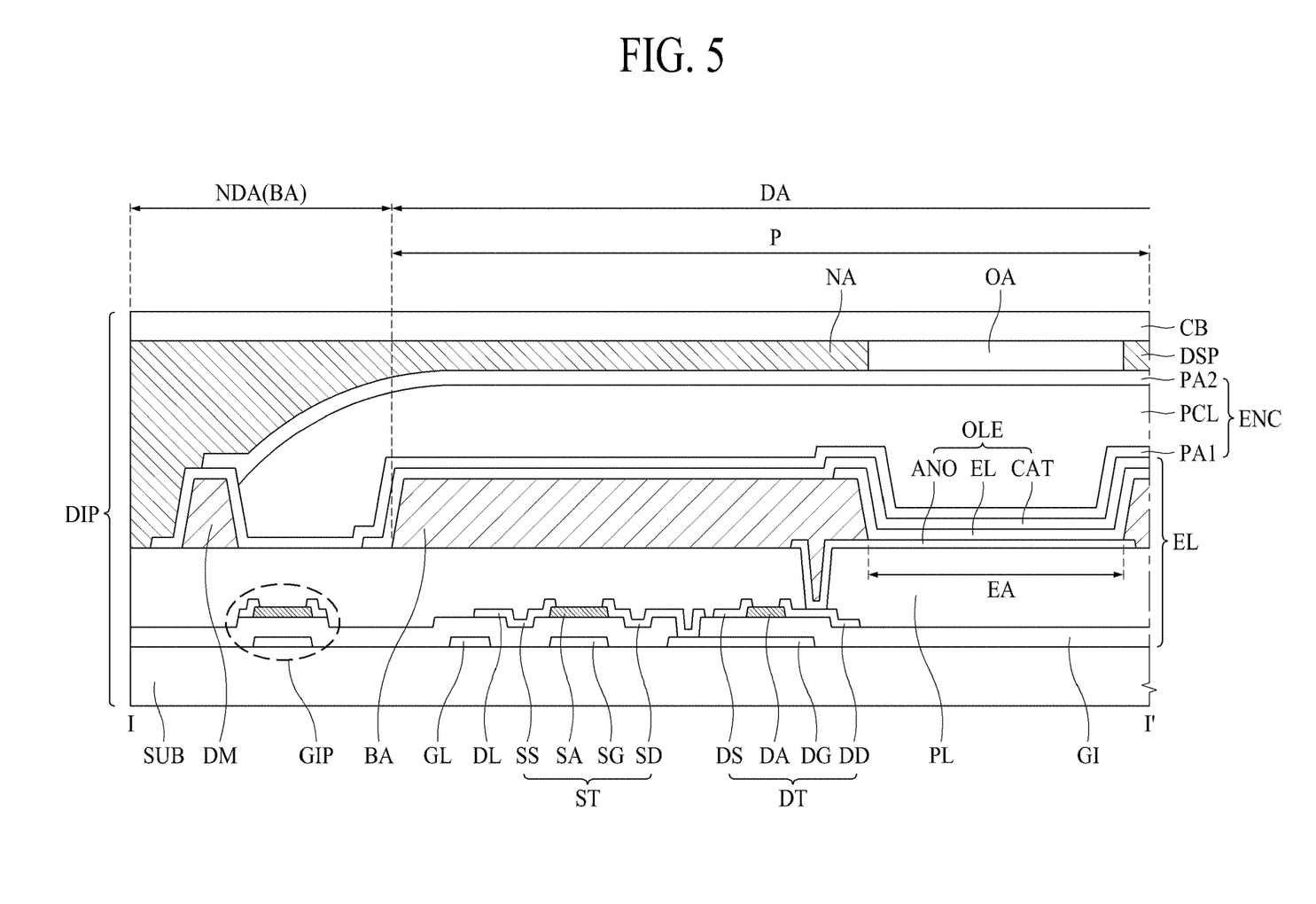
FIG. 5 is a cross-sectional view, along the cutting line I-I' in FIG. 3, illustrating a structure of an electroluminescent display according to a second aspect of the present disclosure.

Hereinafter, referring to FIG. 5, a structure of an electroluminescent display according to the second aspect of the present disclosure will be explained. FIG. 5 is a cross-sectional view, along the cutting line I-I' in FIG. 3, illustrating a structure of an electroluminescent display according to a second aspect of the present disclosure.

Referring to FIG. 5, the electroluminescent display according to the second aspect of the present disclosure may have a structure in which a photo tunable adhesive layer DPS may embedded into the display panel DIP. Comparing with FIG. 4 representing the first aspect, the protective film AR may be removed and the photo tunable adhesive layer DPS may be applied to the optical adhesive OCA for attaching the cover plate CB onto the top surface of encapsulation layer ENC. Here, the top surface of the encapsulation layer ENC may refer to the surface providing the image information to the observers. Hereinafter, the same explanation with the first aspect may not be duplicated.

The display panel DIP may include a display area DA and a non-display area NDA. The display area DA may be an area for representing the video images and may be defined at the most areas including middle area. The non-display area NDA may be defined at the circumference area surrounding the display area DA. In the non-display area NDA, the driving circuits such as a gate driver GIP may be disposed.

The display panel DIP may include a substrate SUB, a display layer EL, an encapsulation layer ENC, a photo tunable adhesive layer DPS and a cover plate CB. The display layer EL may be formed on the top surface of the substrate SUB. Here, the top surface refers to a surface on which the video image is output. The display layer EL may include thin film transistors ST, DT and GIP and the light emitting element OLE.

For example, in the display area DA, a switching thin film transistor ST and a driving thin film transistor DT may be disposed in each pixel P. In the non-display area NDA, the gate driver GIP may be disposed. The detailed structure of the thin film transistors ST and DT may be same with that of the first aspect.

A planarization layer PL may be deposited on the switching thin film transistor ST and the driving thin film transistor DT and the gate driver GIP as covering the whole surface of the substrate SUB. The light emitting element OLE may be formed on the planarization layer PL.

The light emitting element OLE may include an anode electrode ANO, an emission layer OL and a cathode electrode CAT. The anode electrode ANO may be formed on the planarization layer PL and connected to the driving drain electrode DD of the driving thin film transistor DT through a contact hole penetrating the planarization layer PL.

A bank BA may be formed on the anode electrode ANO. The bank BA may expose most middle areas of the anode electrode ANO and cover the circumferences of the anode electrode ANO to define the emission area EA. The emission layer OL may be formed on the bank BA and the anode electrode ANO. The cathode electrode CAT may be formed on the emission layer OL.

The encapsulation layer ENC may be disposed on the cathode electrode CAT for protecting the light emitting element OLE. The encapsulation layer ENC may prevent the gases or the foreign materials from intruding into the display layer EL. The encapsulation layer ENC may have a multiple layer structure in which inorganic layers and organic layers are stacked alternately.

The photo tunable adhesive layer DPS may be disposed on the top surface of the encapsulation layer ENC. The photo tunable adhesive layer DPS may include a light blocking area NA and a light transmitting area OA. The light blocking area NA may have the visible light absorption ratio of 95% or more, and the light transmitting area OA may have a visible light transmittance ratio of 90% or more. The light blocking area NA may be defined as corresponding to the non-emission area excepting the emission area EA within the display area DA. In addition, the light blocking area NA may be defined as corresponding to the whole of the non-display area NDA. The light transmitting area OA may be defined as corresponding to the emission area EA defined in the light emitting element OLE formed in each of the pixels P disposed in the display area DA.

The cover plate CB may be attached onto the photo tunable adhesive layer DPS. The cover plate CB may be made of transparent rigid material, but aspects are not limited thereto. For example, for the flexible display, the cover plate CB may be a transparent flexible film material.

The cover plate CB may have a ultra-violet light blocking property of 98% or more in order to prevent the light transmitting area OA of the photo tunable adhesive layer DPS from being discolored by the ultra-violet lights of sunlight. For example, the cover plate CB may be made of a ultra-violet light blocking material. For another example, the cover plate CB may be made by sequentially stacking the ultra-violet blocking coating layer and a scratch-resistant coating layer on the upper surface of the transparent film. The scratch-resistant coating layer may be for preventing the ultra-violet light blocking coating layer from being peeled off due to the external forces or stresses.

In the electroluminescent display according to the second aspect of the present disclosure, a photo tunable adhesive having visible light absorption rate of 95% or more is disposed in the non-emission areas excluding the emission areas. Therefore, the ambient light reflectance of less than 5% may be acquired without having a linear polarizer and a quarter wave plate to prevent the ambient light reflection.

Comparing with the first aspect, the electroluminescent display according to the second aspect the optical film and the protective film AR may be not included since the photo tunable adhesive layer DPS is applied for attaching the encapsulation layer ENC with the cover plate CB. Therefore, the whole thickness of the display may be thinner than the first aspect, and the manufacturing cost may be further saved. In addition, the cover plate CB may include the property or function of the protective film AR.

In particular, the optical films for preventing reflection of ambient light may reduce about 50% of light amount (luminance or brightness) from the light emitting element, so higher electric power consumption may be required to provide desired luminance. However, the electroluminescent display according to the second aspect of the present disclosure may not include any optical element reducing the light amount provided from the light emitting element, so the same luminance may be provided with lower power consumption.

<Third Aspect>

Figure 6:
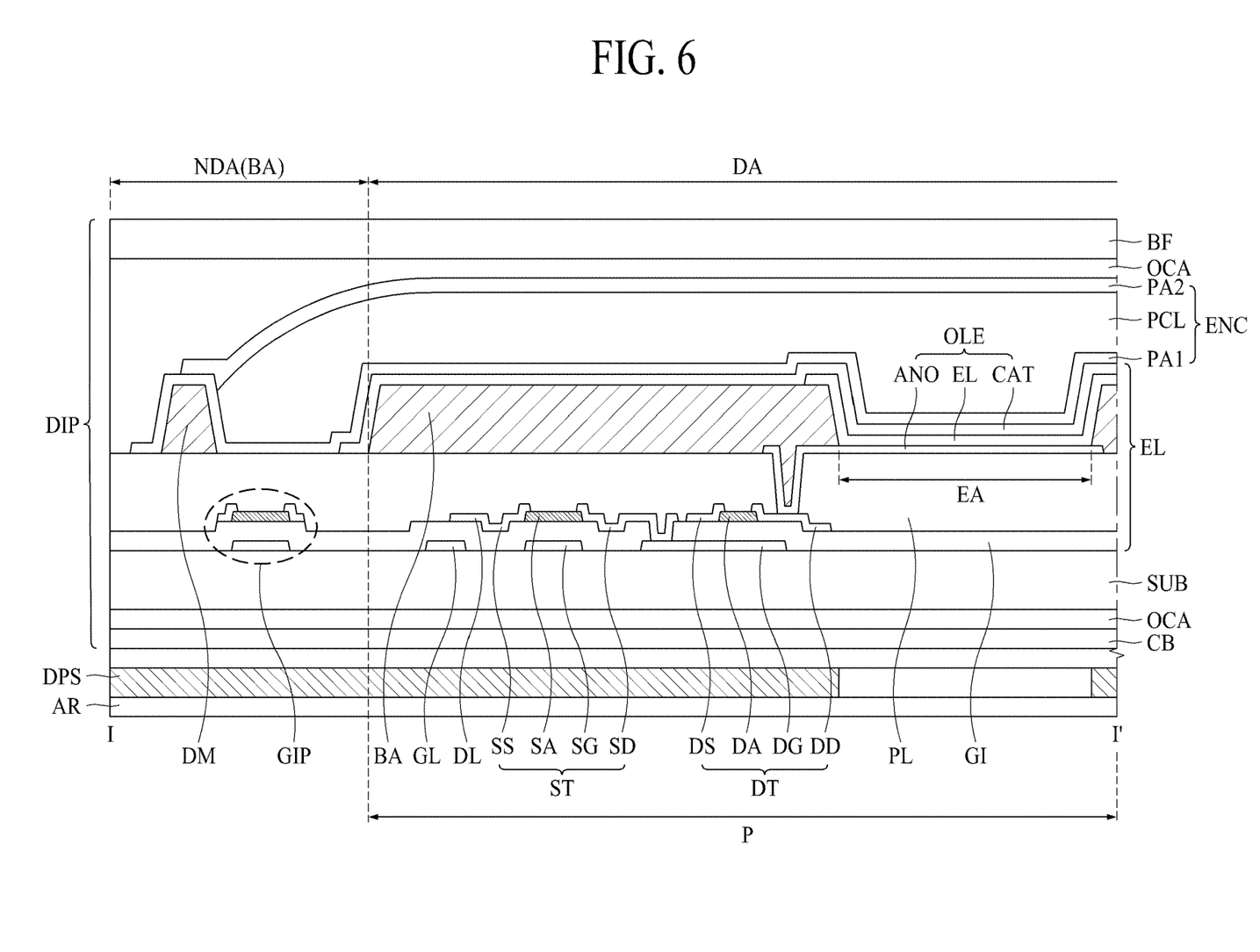
FIG. 6 is a cross-sectional view, along the cutting line I-I' in FIG. 3, illustrating a structure of an electroluminescent display according to a third aspect of the present disclosure.

Hereinafter, referring to FIG. 6, a structure of an electroluminescent display according to the third aspect of the present disclosure will be explained. FIG. 6 is a cross-sectional view, along the cutting line I-I' in FIG. 3, illustrating a structure of an electroluminescent display according to a third aspect of the present disclosure.

Referring to FIG. 6, an electroluminescent display according to the third aspect of the present disclosure may comprise a display panel DIP, a protective film AR and a photo tunable adhesive layer DPS. In particular, the protective film AR may be attached on the bottom surface of the display panel DIP by the photo tunable adhesive layer DPS. Here, the bottom surface of the display panel DIP refers to the surface on which image information is provided. The third aspect is related to the bottom emission type display panel DIP.

The display panel DIP may include a display area DA and a non-display area NDA. The display area DA may be an area for representing the video images and may be defined at the most areas including middle area. The non-display area NDA may be defined at the circumference area surrounding the display area DA. In the non-display area NDA, the driving circuits such as a gate driver GIP may be disposed.

The display panel DIP may include a substrate SUB, a display layer EL, an encapsulation layer ENC, a back plate BF and a cover plate CB. The display layer EL may be formed on the top surface of the substrate SUB. Here, the top surface refers to an opposite surface to a surface on which the video image is output. The display layer EL may include thin film transistors ST, DT and GIP and the light emitting element OLE.

In one example, in the display area DA, a switching thin film transistor ST and a driving thin film transistor DT may be disposed in each pixel P. In the non-display area NDA, the gate driver GIP may be disposed. The structure of the thin film transistors ST and DT may be same with that of the first aspect, so the same explanation may not be duplicated.

A planarization layer PL may be deposited on the switching thin film transistor ST and the driving thin film transistor DT and the gate driver GIP as covering the whole surface of the substrate SUB. The light emitting element OLE may be formed on the planarization layer PL.

The light emitting element OLE may include an anode electrode ANO, an emission layer OL and a cathode electrode CAT. The anode electrode ANO may be formed on the planarization layer PL and connected to the driving drain electrode DD of the driving thin film transistor DT through a contact hole penetrating the planarization layer PL.

A bank BA may be formed on the anode electrode ANO. The bank BA may expose most middle areas of the anode electrode ANO and cover the circumferences of the anode electrode ANO to define the emission area EA.

The emission layer OL may be formed on the bank BA and the anode electrode ANO. The cathode electrode CAT may be formed on the emission layer OL. The cathode electrode CAT may be continuously deposited over the whole of the display area DA. In addition, the cathode electrode CAT may be extended to some of the non-display area NDA over the display area DA. For example, the cathode electrode CAT may have a structure to cover the upper portion of the gate driver GIP to shield the gate driver GIP.

In the third aspect, the lights radiated from the light emitting element OLE may be provided to the down direction of the substrate SUB. Therefore, the cathode electrode CAT may include a metal material having excellent reflectance rate, and the anode electrode ANO may include a transparent conductive material. For example, the cathode electrode CAT may include any one metal material such as silver (Ag), aluminum (Al), nickel (Ni) and copper (Cu) or alloy of them. In addition, the anode electrode ANO may include indium tin oxide (ITO), or indium zinc oxide (IZO).

The encapsulation layer ENC may be disposed on the cathode electrode CAT for protecting the light emitting element OLE. The encapsulation layer ENC may prevent the gases or the foreign materials from intruding into the display layer EL. The encapsulation layer ENC may have a multiple layer structure in which inorganic layers and organic layers are stacked alternately. For example, the encapsulation layer ENC may include a first inorganic layer PA1, an organic layer PCL on the first inorganic layer PA1 and a second inorganic layer PA2 on the organic layer PCL.

A dam DM may be formed in the non-display area NDA to surround the display area DA so that the organic layer PCL is disposed within the area where the light emitting element OLE is formed. The organic layer PCL may be disposed inner space surrounded by the dam DM.

The back plate BF may be attached on the encapsulation layer ENC. For example, applying an optical adhesive OCA on the upper surface of the encapsulation layer ENC, the back plate BF may be attached thereon. The back plate BF may be a transparent protective substrate for preventing damage to the encapsulation layer ENC and the display layer EL disposed below by the external forces. In the third aspect, since the lights from the light emitting element OLE may be provided to the bottom direction of the substrate SUB, the back plate BF may be made of an opaque metal material.

The photo tunable adhesive layer DPS may be disposed on the bottom surface of the substrate SUB. The photo tunable adhesive layer DPS may include a light blocking area NA and a light transmitting area OA. The light blocking area NA may have the visible light absorption ratio of 95% or more, and the light transmitting area OA may have a visible light transmittance ratio of 90% or more.

The light blocking area NA may be defined as corresponding to the non-emission area excepting the emission area EA within the display area DA. In addition, the light blocking area NA may be defined as corresponding to the whole of the non-display area NDA. The light transmitting area OA may be defined as corresponding to the emission area EA defined in the light emitting element OLE formed in each of the pixels P disposed in the display area DA.

The protective film AR may be attached onto the photo tunable adhesive layer DPS. The protective film AR may be made of transparent rigid material, but aspects are not limited thereto. For example, for the flexible display, the protective film AR may be a transparent flexible film material.

The protective film AR may have a ultra-violet light blocking property of 98% or more in order to prevent the light transmitting area OA of the photo tunable adhesive layer DPS from being discolored by the ultra-violet lights of sunlight. For example, the protective film AR may be made of a ultra-violet light blocking material. For another example, the protective film AR may be made by sequentially stacking the ultra-violet blocking coating layer and a scratch-resistant coating layer on the upper surface of the transparent film. The scratch-resistant coating layer may be for preventing the ultra-violet light blocking coating layer from being peeled off due to the external forces or stresses. As the result, the performance for blocking the ultra-violet lights may be increased, and the ultra-violet light prevention coating layer may be prevented from being damaged.

In some cases, a coating layer for preventing the reflection of ambient light may be further included. The ambient lights may be reflected by the light transmitting area OA. However, in the third aspect of the present disclosure, due to the ambient reflection prevention coating layer, the ambient reflection may be reduced at the light transmitting area OA. As the result, the total light reflection ratio over the whole display panel may be lower than 5%.

In the electroluminescent display according to the third aspect of the present disclosure, a photo tunable adhesive having visible light absorption rate of 95% or more is disposed in the non-emission areas excluding the emission areas. Therefore, the ambient light reflectance of less than 5% may be acquired without having a linear polarizer and a quarter wave plate to prevent the ambient light reflection.

Since the optical film for preventing the reflection of ambient light is not included, the overall thickness of the display may be thinner than related art, and the manufacturing cost may be saved. The electroluminescent display according to the third aspect of the present disclosure may not include any optical element reducing the light amount provided from the light emitting element, so the same luminance may be provided with lower power consumption.

Even though not shown in figures, applying the feature of the third aspect to the second aspect, the photo tunable adhesive layer DPS may be applied onto the bottom surface of the substrate and the cover plate CB may be attached thereon. In this case, the protective film AR may not be included, and the cover plate CB may include the property and function of the protective film AR.

Features, structures, effects and so on described in the above described examples of the present disclosure are included in at least one example of the present disclosure, and are not necessarily limited to only one example. Furthermore, features, structures, effects and so on exemplified in at least one example of the present disclosure may be implemented by combining or modifying other examples by a person having ordinary skilled in this field. Therefore, contents related to such combinations and modifications should be interpreted as being included in the scope of the present application.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. An electroluminescent display, comprising:
   a display panel including a plurality of pixels, each pixel having an emission area and non-emission area; and
   a protective film attached on one surface of the display panel by a photo tunable adhesive,
   wherein the photo tunable adhesive includes:
   a light transmitting area corresponding to the emission area; and
   a light blocking area corresponding to the non-emission area.

2. The electroluminescent display according to claim 1, wherein the light transmitting area has a light transmittance rate of 90% or more, and the light blocking area has a light absorption rate of 95% or more.

3. The electroluminescent display according to claim 1, wherein the light blocking area is selectively defined by irradiating the ultra-violet lights.

4. The electroluminescent display according to claim 1, wherein the display panel includes:
   a substrate where the plurality of pixels is defined;
   a display layer having a thin film transistor and a light emitting element disposed in each pixel on the substrate; and
   an encapsulation layer covering the display layer.

5. The electroluminescent display according to claim 4, wherein the photo tunable adhesive is disposed on a top surface of the encapsulation layer; and
   wherein the protective film is attached onto the photo tunable adhesive.

6. The electroluminescent display according to claim 4, wherein the photo tunable adhesive is disposed onto the bottom surface of substrate; and
   wherein the protective film is attached onto the photo tunable adhesive.

7. The electroluminescent display according to claim 4, further comprising a cover plate attached onto the encapsulation layer with the photo tunable adhesive, wherein the photo tunable adhesive is disposed on a top surface of the cover plate, and wherein the protective film is attached on the photo tunable adhesive.

8. The electroluminescent display according to claim 1, wherein the protective film includes a ultra-violet light blocking film.

9. The electroluminescent display according to claim 1, wherein the protective film includes a ultra-violet protection coating layer and a scratch-preventing coating layer sequentially stacked on a surface of the substrate.

10. The electroluminescent display according to claim 9, wherein the protective film further includes an ambient reflection prevention coating layer.

11. The electroluminescent display according to claim 1, wherein the display panel further includes:
- a display area defined at a middle area of the display panel; and
- a non-display area defined at a circumference surrounding the display area,
- wherein the light blocking area of the photo tunable adhesive corresponds to the non-emission area.

12. An electroluminescent display, comprising:
- a display panel where a display area and a non-display area are defined;
- a plurality of pixels disposed in the display panel and including an emission area and a non-emission area;
- a protective film disposed on the display panel;
- a photo tunable adhesive attaching the protective film to the display panel and including a light transmitting area corresponding to the emission area and a light blocking area corresponding to the non-emission area,
- wherein the light blocking area is extended from the non-display area to the non-emission area of the display area.

13. The electroluminescent display according to claim 12, further comprising a cover plate attached onto the encapsulation layer with the photo tunable adhesive disposed on a top surface of the cover plate.

14. The electroluminescent display according to claim 12, wherein the protective film includes a ultra-violet light blocking film.

15. The electroluminescent display according to claim 12, wherein the protective film includes a ultra-violet protection coating layer and a scratch-preventing coating layer sequentially stacked on a surface of the substrate.

16. The electroluminescent display according to claim 15, wherein the protective film further includes an ambient reflection prevention coating layer.

17. The electroluminescent display according to claim 12, wherein the photo tunable adhesive includes an optical adhesive material and a photochromic dye material.

* * * * *